United States Patent [19]
Park et al.

[11] Patent Number: 5,341,027
[45] Date of Patent: Aug. 23, 1994

[54] SEMICONDUCTOR CHIP HAVING NOTCHES FORMED IN PERIPHERAL EDGES THEREOF

[75] Inventors: Jong Y. Park, Bucheon; Hag J. Jung, Seoul, both of Rep. of Korea

[73] Assignee: Samsung Electronics Co., Ltd., Kyungki, Rep. of Korea

[21] Appl. No.: 955,778

[22] Filed: Oct. 2, 1992

[30] Foreign Application Priority Data

Nov. 14, 1991 [KR] Rep. of Korea ............ 91-20271

[51] Int. Cl.$^5$ ............................................. H01L 29/40
[52] U.S. Cl. .................................. 257/786; 257/784; 257/666; 257/668
[58] Field of Search ............... 257/666, 668, 673, 784, 257/786, 785, 773, 734

[56] References Cited

U.S. PATENT DOCUMENTS

| | | | |
|---|---|---|---|
| 4,622,574 | 11/1986 | Garcia | 257/786 |
| 4,733,289 | 3/1988 | Tsurumaru | 257/786 |
| 4,862,249 | 8/1989 | Carlson | 257/668 |
| 5,136,367 | 8/1992 | Chiu | 257/673 |
| 5,266,833 | 11/1993 | Capps | 257/690 |

FOREIGN PATENT DOCUMENTS

| | | | |
|---|---|---|---|
| 0187269 | 8/1986 | Japan | 257/786 |
| 0143229 | 6/1989 | Japan | 257/786 |
| 0150347 | 6/1989 | Japan | 257/666 |
| 0319955 | 12/1989 | Japan | 257/784 |
| 0179135 | 6/1992 | Japan | 257/673 |
| 0247632 | 9/1992 | Japan | 257/784 |

*Primary Examiner*—Rolf Hille
*Assistant Examiner*—Peter Toby Brown
*Attorney, Agent, or Firm*—Robert A. Westerlund; Stephen R. Whitt; Charles R. Donohoe

[57] ABSTRACT

A semiconductor device which includes a semiconductor integrated circuit chip provided with a plurality of chip bonding pads contiguous with the peripheral edge of the chip, and a plurality of leads directly bonded to respective ones of the chip bonding pads. The bonding pads are preferably formed within respective notches disposed in a marginal edge portion of the chip, with each of the notches having an open end formed in the peripheral edge of the chip. By locating the chip bonding pads contiguous with the peripheral edge of the chip, rather than a prescribed distance away from the peripheral edge of the chip, the bonding pads are directly accessible from the edge of the chip, thereby enabling the leads to be directly bonded to the bonding pads, and thus eliminating the need for bonding bumps or balls.

5 Claims, 4 Drawing Sheets

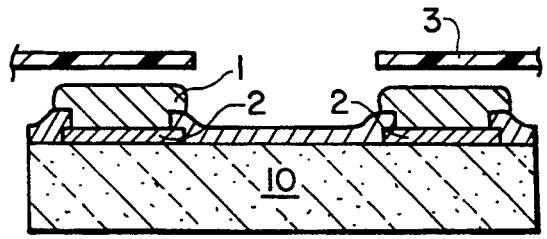
FIG. IA
(PRIOR ART)
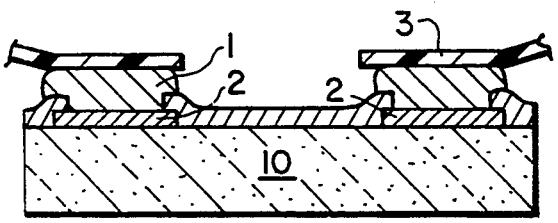
FIG. IB
(PRIOR ART)
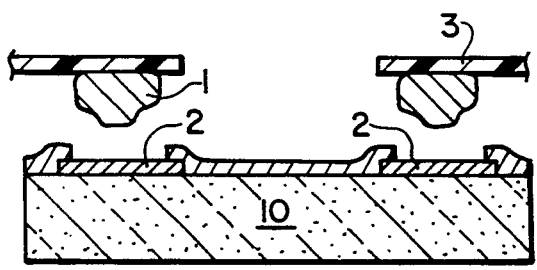
FIG. 2A
(PRIOR ART)
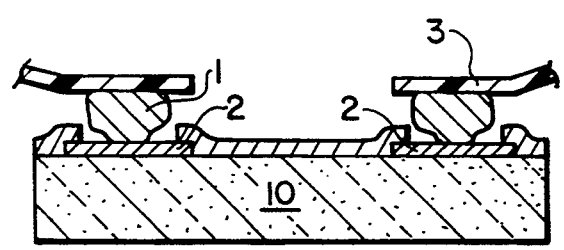
FIG. 2B
(PRIOR ART)
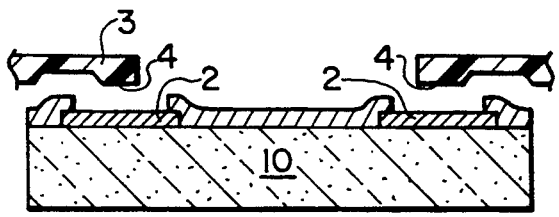
FIG. 3A
(PRIOR ART)
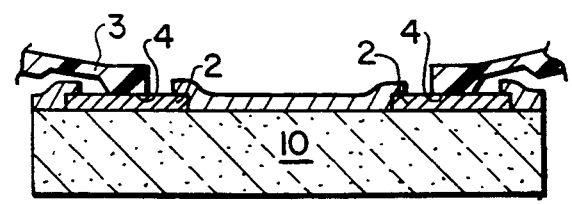
FIG. 3B
(PRIOR ART)

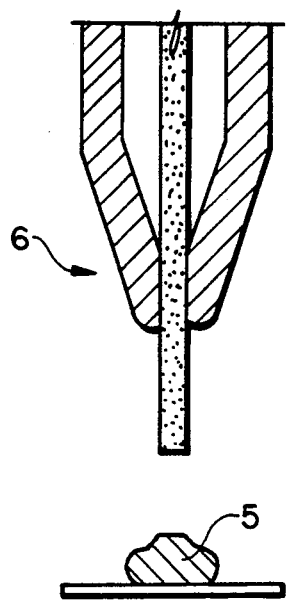
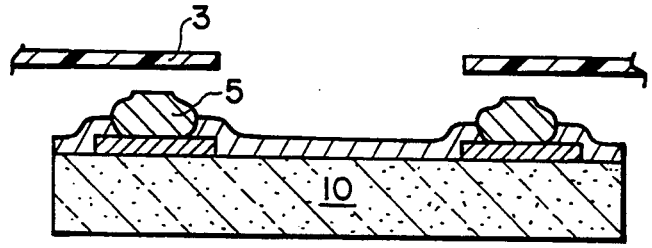
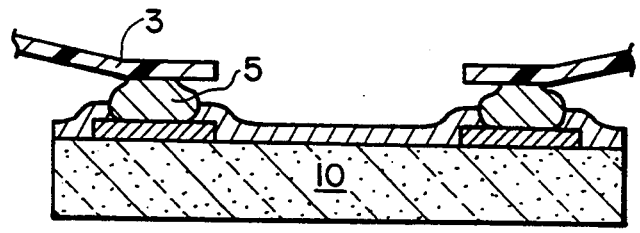
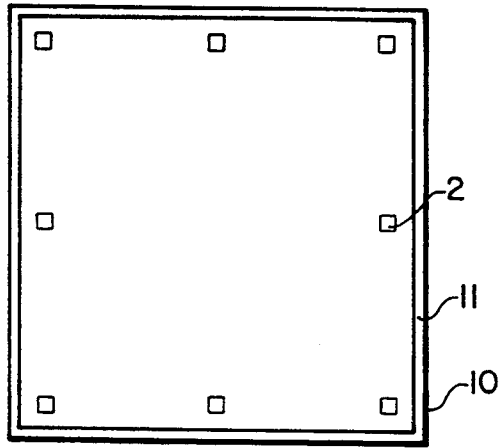
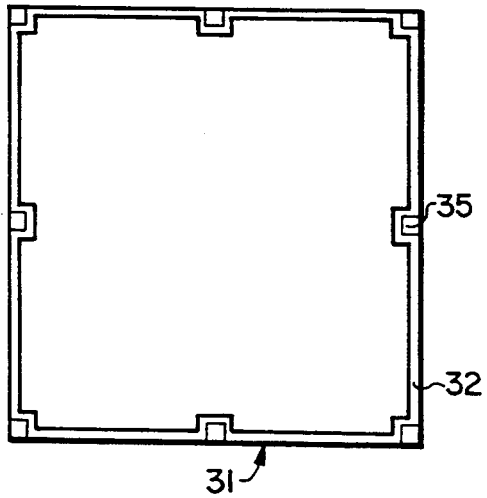

SEMICONDUCTOR CHIP HAVING NOTCHES FORMED IN PERIPHERAL EDGES THEREOF

BACKGROUND OF THE INVENTION

The present invention relates generally to semiconductor devices, and, more particularly, to a semiconductor chip having bonding pads which are directly bonded to respective leads.

As semiconductor technology continues to rapidly evolve towards multi-functional semiconductor devices with continuously increasing integration levels and decreasing feature size, a need has arisen for miniature, multi-pin-compatible semiconductor packages to accommodate these devices. Several different types of semiconductor packages have been developed to meet this need, the most popular of which are TQFPs (Thin Quad Flat Packages), TSOPs (Thin Small Outline Packages), FCPs (Flip Chip Packages), and TABPs (Tape Automated Bonding Packages).

In order to facilitate easy attachment of a semiconductor package of any of the above-enumerated types to a printed circuit or wiring board, various tape automated bonding (TAB) techniques have been developed.

In a first prior art TAB technique, depicted in FIGS. 1A and 1B, metal bumps 1 are formed on electrode terminals or chip bonding pads 2 provided on a semiconductor I.C. chip 10, and leads 3 of a lead frame (not shown) are bonded to the chip bonding pads 2. Each of the leads 3 may be comprised of a segment of TAB tape.

In a second prior art TAB technique, depicted in FIGS. 2A and 2B, the metal bumps 1 are formed on distal end portions of the leads 3, and then bonded to the chip bonding pads 2.

In a third prior art TAB technique, depicted in FIGS. 3A and 3B, the distal end portions of the leads 3 are formed in the shape of mesas or bumps 4 which are then bonded to the chip bonding pads 2. This technique is commonly referred to as the mesa bump bonding technique.

In a fourth prior art TAB technique, depicted in FIGS. 4A–4C, a gold (Au) ball 5 is formed on each chip bonding pad 2 by use of a ball-forming device 6, and the leads 3 are then bonded to the gold balls 5. Alternatively, the gold balls 5 can be formed on the distal end portions of the leads 3.

In accordance with all of the above-described prior art TAB techniques, the step of bonding the leads 3 to the chip bonding pads 2 is performed after a bump or ball is formed on the leads or the pads. With reference now to FIG. 5, the chip bonding pads 2 are located a prescribed distance away from the peripheral edge 11 of the chip 10, and under a passivation layer (not shown). Accordingly, to facilitate the bonding step, it is necessary that the bump or ball be thicker than the passivation layer, which unduly increases the thickness of the overall device. Moreover, the above-described prior art TAB techniques are unduly complex and expensive, in that each of them entails an additional process step to form the bump or ball.

Thus, as is evident from the foregoing, there presently exists a need for a semiconductor device which overcomes the disadvantages and shortcomings of the presently available semiconductor devices. The present invention fulfills this need.

SUMMARY OF THE INVENTION

The present invention encompasses a semiconductor device which includes a semiconductor integrated circuit chip provided with a plurality of chip bonding pads contiguous with the peripheral edge of the chip, and a plurality of leads directly bonded to respective ones of the chip bonding pads. The bonding pads are preferably formed within respective notches disposed in a marginal edge portion of the chip, with each of the notches having an open end formed in the peripheral edge of the chip. By locating the chip bonding pads contiguous with the peripheral edge of the chip, rather than a prescribed distance away from the peripheral edge of the chip, the bonding pads are directly accessible from the edge of the chip, thereby enabling the leads to be directly bonded to the bonding pads, and thus eliminating the need for bonding bumps or balls.

The present invention also encompasses a method for fabricating a semiconductor device including a first semiconductor chip fabricated in a first chip area of a semiconductor wafer which is partitioned into a multiplicity of chip areas defined by a grid-like array of scribe lines inscribed into the surface of the wafer. The method includes the following steps. First, a plurality of notches are formed in a marginal edge portion of each of the chip areas contiguous with respective ones of the scribe lines. Second, a plurality of chip bonding pads are formed within respective ones of the notches. Third, the wafer is sliced along the scribe lines to separate the wafer into a multiplicity of individual semiconductor chips, including the first semiconductor chip. Finally, a plurality of leads are directly bonded to respective ones of the chip bonding pads of the first semiconductor chip.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which:

FIGS. 1A and 1B are cross-sectional views of a semiconductor device, illustrating a first prior art TAB bonding technique;

FIG. 2A and 2B are cross-sectional views of a semiconductor device, illustrating a second prior art TAB bonding technique;

FIGS. 3A and 3B are cross-sectional views of a semiconductor device, illustrating a third prior art TAB bonding technique;

FIGS. 4A–4C are cross-sectional views of a semiconductor device, illustrating a fourth prior art TAB bonding technique;

FIG. 5 is a plan view of a prior art semiconductor chip compatible with any of the prior art TAB bonding techniques depicted in FIGS. 1A–4C;

FIG. 6 is a plan view of a semiconductor chip fabricated in accordance with the present invention;

DETAILED DESCRIPTION OF THE INVENTION

With reference now to FIG. 6, a semiconductor I.C. chip 31 constructed in accordance with the present invention will now be described. More particularly, the semiconductor I.C. chip 31 includes a plurality of chip bonding pads 35 arranged about the periphery thereof. The bonding pads 35 are preferably contiguous with the peripheral edge 32 of the chip 31, and are preferably equally spaced-apart. Thus, rather than locating the bonding pads a prescribed distance away from the peripheral edge of the chip, as is done in the prior art, in accordance with the present invention, the bonding pads 35 are contiguous with the peripheral edge 32 of the chip 31.

Figure 10:
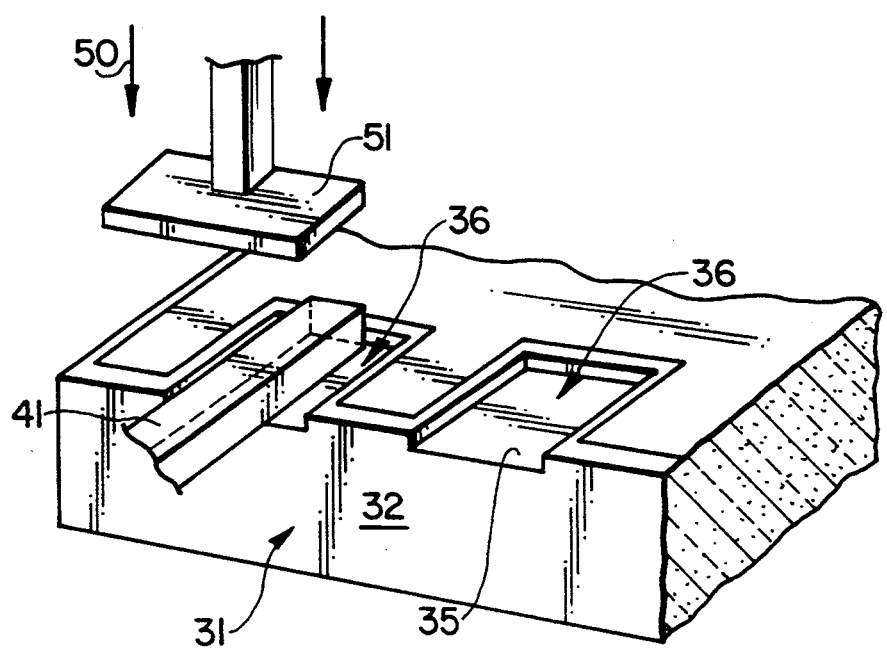

As can best be seen in FIG. 10, the bonding pads 35 are preferably formed in notches 36 provided in a marginal edge portion of the chip 31. Each of the notches 36 preferably has an open end formed in the peripheral edge 32 of the chip 31, to permit direct bonding of a respective lead 41 to a respective bonding pad 35. The open-endedness of the notches 36 permits direct edge access to the bonding pads 35, whereas with the prior art, the bonding pads must be accessed overhead, thereby necessitating the use of bonding bumps or balls to facilitate the bonding of the leads to the bonding pads. Thus, the open-endedness of the notches 36 enables the leads 41 to be directly bonded to the bonding pads 35, without the need for bonding bumps or balls.

With continuing reference to FIG. 10, the leads 41 are preferably directly bonded to respective ones of the bonding pads 35 by means of an ultrasonic bonding process. The ultrasonic bonding process is preferably carried out in the following manner. More particularly, ultrasonic energy, (represented by the arrows 50), generated by an ultrasonic generator (not shown), and downwardly directed pressure exerted by a pressure pad or platen 51 driven by any suitable driving mechanism (not shown), e.g., a hydraulic or pneumatic actuator, are applied to the bonding site, to thereby directly bond the leads 41 to their respective bonding pads 35, without the need for application of any heat.

Figure 9:
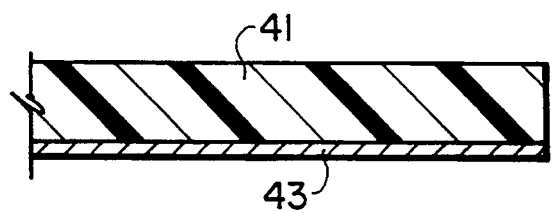
FIG. 9 is a fragmentary, cross-sectional view of a lead constructed in accordance with a preferred embodiment of the present invention; and, FIG. 10 is a fragmentary, perspective view of a semiconductor device fabricated in accordance with a preferred embodiment of the present invention.

As shown in FIG. 9, in order to enhance the bond between the bonding pads 35 and the leads 41 in the above-described ultrasonic bonding process, each of the leads 41 is preferably provided with an aluminum layer or skin 43 deposited over the surface thereof to be bonded to a respective bonding pad 35. The aluminum skin 43 is preferably less than 100 μm thick. The bonding pads 35 are also preferably made of aluminum, so that a tenacious bond can be achieved between the leads 41 and the bonding pads 35 during the ultrasonic bonding process, by virtue of mutual diffusion of the aluminum atoms of the bonding pads 35 and the leads 41. Further, the bonding pads 35 are preferably thicker than conventional bonding pads, in order to minimize the incidence of defects due to inadequate bonding and cratering caused by unfinished alloy formation during the low-temperature, low-pressure ultrasonic bonding process. However, since the bonding pads 35 are formed in recessed notches 36, the overall thickness of the finished product is not increased.

Figure 7:
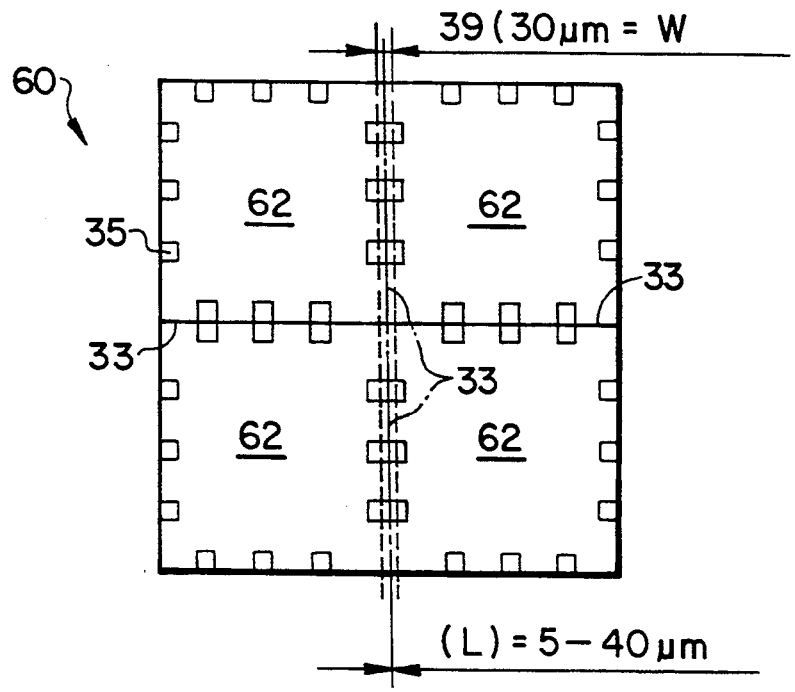
FIG. 7 is a plan view of a semiconductor wafer including four semiconductor chips fabricated in accordance with the present invention.

In order to more fully describe the present invention, reference is now made to FIG. 7, wherein a semiconductor wafer 60 in which four separate I.C. chips 31 of the present invention are fabricated is shown. In a semiconductor wafer fabrication process, the semiconductor wafer 60 is partitioned into a multiplicity n (here, n is only four, for convenience of illustration) of chip or die areas 62 defined by a grid-like array of scribe lines 33 inscribed into the surface of the wafer 60. Generally, an integrated circuit (not shown) is formed in each chip area 62.

Figure 8:
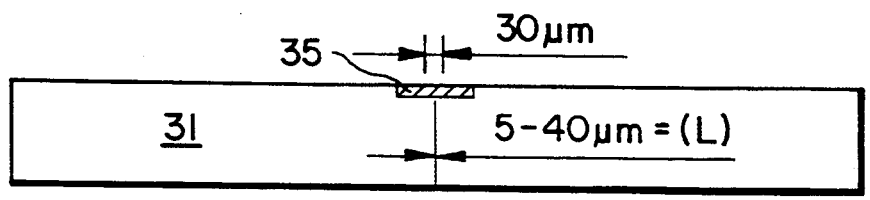
FIG. 8 is a cross-sectional view depicting a chip bonding pad formed on a scribe line separating two adjacent semiconductor chips formed in the wafer depicted in FIG. 7.

Ultimately, the wafer 60 is sliced, e.g., by means of a diamond-tipped saw or laser cutting tool, along the scribe lines 33, into a multiplicity n of individual I.C. chips 31. With specific reference now to FIG. 8, in order to optimize this wafer slicing process, a very fine separation distance L is preferably provided between the bonding pads 35 of adjacent ones of the chips 31 fabricated in the wafer 60. The distance L is preferably within a range of between 5 μm to 40 μm, and the width W of the sawblade/laser cutter swath 39 is preferably within a range of between 15 μm and 30 μm.

Based upon the foregoing, it should be appreciated that a semiconductor device made in accordance with the present invention is thinner than presently available semiconductor devices by at least the thickness of the bonding bumps or balls thereof. Moreover, the fabrication process of the present invention is simpler and less expensive than the conventional fabrication process.

Although the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A semiconductor device, including:
   a semiconductor chip having top and bottom major surfaces and a plurality of peripheral edges joining said top and bottom major surfaces, said semiconductor chip being provided with a plurality of spaced-apart notches formed in at least one of said peripheral edges of said chip with each of said notches extending laterally inwardly a prescribed distance from a corner formed at the juncture of said top major surface and a corresponding one of said plurality of peripheral edges of said chip;
   a plurality of bonding pads disposed within respective ones of said notches, said bonding pads being recessed from said top surface of said chip; and
   a plurality of leads bonded to respective ones of said bonding pads.

2. The device as set forth in claim 1, wherein each of said leads comprises an elongated base member and a metal layer provided on a surface thereof which is directly bonded to a respective one of said bonding pads.

3. The device as set forth in claim 1, wherein said metal layer of each of said leads is made of aluminum and each of said bonding pads is made of aluminum.

4. The device as set forth in claim 1, wherein each of said leads is attached to a TAB tape.

5. The device as set forth in claim 1, wherein each of said leads is connected to a lead frame.

* * * * *